United States Patent
Han et al.

(10) Patent No.: US 8,017,472 B2
(45) Date of Patent: Sep. 13, 2011

(54) CMOS DEVICES HAVING STRESS-ALTERING MATERIAL LINING THE ISOLATION TRENCHES AND METHODS OF MANUFACTURING THEREOF

(75) Inventors: Jin-Ping Han, Fishkill, NY (US); Yung Fu (Alfred) Chong, Singapore (SG)

(73) Assignees: Infineon Technologies AG, Munich (DE); Chartered Semiconductor Manufacturing, Ltd., Singapore (SG)

( * ) Notice: Subject to any disclaimer, the term of this patent is extended or adjusted under 35 U.S.C. 154(b) by 453 days.

(21) Appl. No.: 11/356,666

(22) Filed: Feb. 17, 2006

(65) Prior Publication Data

US 2007/0196996 A1 Aug. 23, 2007

(51) Int. Cl.
*H01L 21/8238* (2006.01)
*H01L 21/76* (2006.01)
(52) U.S. Cl. .................. 438/222; 438/429; 257/E21.546
(58) Field of Classification Search .................. 438/424, 438/429, 221, 222, 359, 296, 360, 430, 361, 438/435, 437; 257/E21.546
See application file for complete search history.

(56) References Cited

U.S. PATENT DOCUMENTS

| | | | | |
|---|---|---|---|---|
| 6,596,186 | B2* | 7/2003 | Yasuda et al. | 216/41 |
| 7,291,528 | B2* | 11/2007 | Chen et al. | 438/199 |
| 2002/0104477 | A1* | 8/2002 | Yamoto et al. | 117/94 |
| 2002/0167066 | A1* | 11/2002 | Ueno et al. | 257/505 |
| 2003/0071321 | A1* | 4/2003 | Hong | 438/424 |
| 2004/0036142 | A1* | 2/2004 | Shima | 257/510 |
| 2004/0212035 | A1* | 10/2004 | Yeo et al. | 257/510 |
| 2005/0095807 | A1* | 5/2005 | Xiang | 438/424 |
| 2005/0116217 | A1* | 6/2005 | Jones et al. | 257/19 |
| 2005/0121727 | A1* | 6/2005 | Ishitsuka et al. | 257/369 |
| 2005/0164437 | A1 | 7/2005 | Kang et al. | |
| 2005/0245081 | A1 | 11/2005 | Chakravarti et al. | |
| 2005/0255667 | A1 | 11/2005 | Arghavani et al. | |
| 2006/0003546 | A1* | 1/2006 | Klipp et al. | 438/431 |
| 2007/0170542 | A1* | 7/2007 | Derderian | 257/510 |

* cited by examiner

*Primary Examiner* — Matthew C Landau
*Assistant Examiner* — Daniel Luke
(74) *Attorney, Agent, or Firm* — Slater & Matsil, L.L.P.

(57) ABSTRACT

Semiconductor devices and methods of manufacturing thereof are disclosed. Isolation regions are formed that include a stress-altering material at least partially lining a trench formed within a workpiece. The isolation regions include an insulating material disposed over the stress-altering material.

31 Claims, 5 Drawing Sheets

CMOS DEVICES HAVING STRESS-ALTERING MATERIAL LINING THE ISOLATION TRENCHES AND METHODS OF MANUFACTURING THEREOF

The invention claimed herein was made subject to and as a result of a joint research agreement between Infineon Technologies and Chartered Semiconductor Manufacturing, Ltd.

TECHNICAL FIELD

The present invention relates generally to the fabrication of semiconductor devices, and more particularly to the fabrication of isolation regions of semiconductor devices and structures thereof.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip, for example.

Isolation regions are often used to provide electrical isolation between active regions or electronic components formed on an integrated circuit. Shallow trench isolation (STI) and deep trench (DT) isolation are examples of some types of isolation regions that are widely used in semiconductor devices, although there are other types of isolation regions that may be formed.

STI regions are often used in complementary metal oxide semiconductor (CMOS) devices, for example, which use both positive and negative channel devices in complementary configurations. The positive and negative channel devices of CMOS devices are typically referred to as p channel metal oxide semiconductor (PMOS) and n channel metal oxide semiconductor (NMOS) transistors. A PMOS transistor is formed in an n well (e.g., a well implanted with n type dopants) and an NMOS transistor is formed in a p well. An STI region is formed between the n well and p well of the PMOS transistor and the NMOS transistor, respectively. In CMOS applications, the STI region usually extends within a semiconductor substrate by about the depth of the maximum n well and p well doping concentration, by about 200 to 1,000 nm, for example.

To form isolation regions, trenches are usually formed in a substrate, and the trenches are filled with insulating materials. Etch processes and chemical mechanical polishing (CMP) processes are typically used to remove excess insulating material from the top surface of the substrate.

Improved methods of forming isolation regions and structures thereof are needed in the art.

SUMMARY OF THE INVENTION

Embodiments of the present invention achieve technical advantages by providing novel methods of forming isolation regions and structures thereof.

In accordance with a preferred embodiment of the present invention, a method of fabricating a semiconductor device includes providing a workpiece and forming at least one isolation region within the workpiece. The at least one isolation region includes a stress-altering material at least partially lining a trench formed within the workpiece. An insulating material is disposed over the stress-altering material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, for formation of STI regions of semiconductor devices. The invention may also be applied, however, to other isolation regions of semiconductor devices, such as deep trench (DT) isolation regions, isolation regions comprising STI regions combined with DT isolation regions, or other types of isolation regions, as examples.

Figure 1:
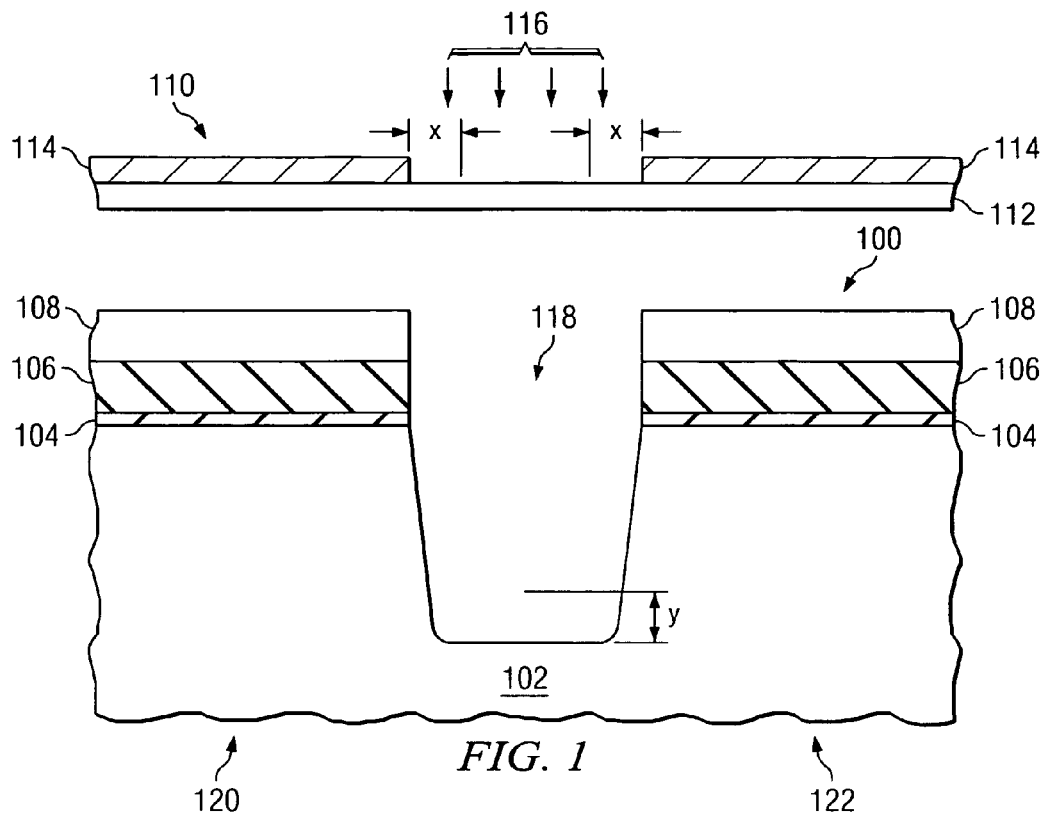
FIGS. 1 through 3 show cross-sectional views of a method of fabricating an isolation region of a semiconductor device in accordance with a preferred embodiment of the present invention.
Figure 2:
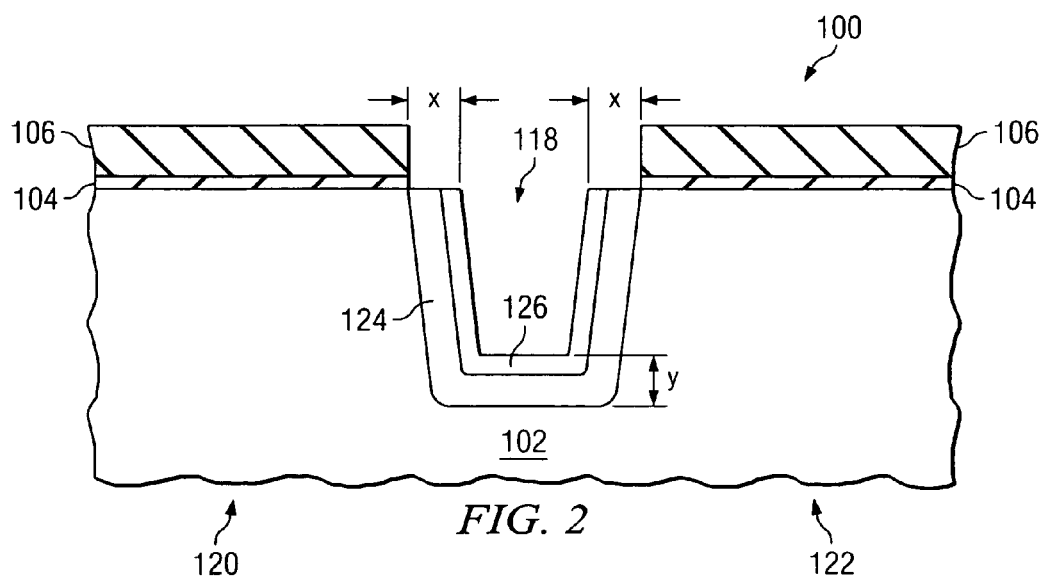
Figure 3:
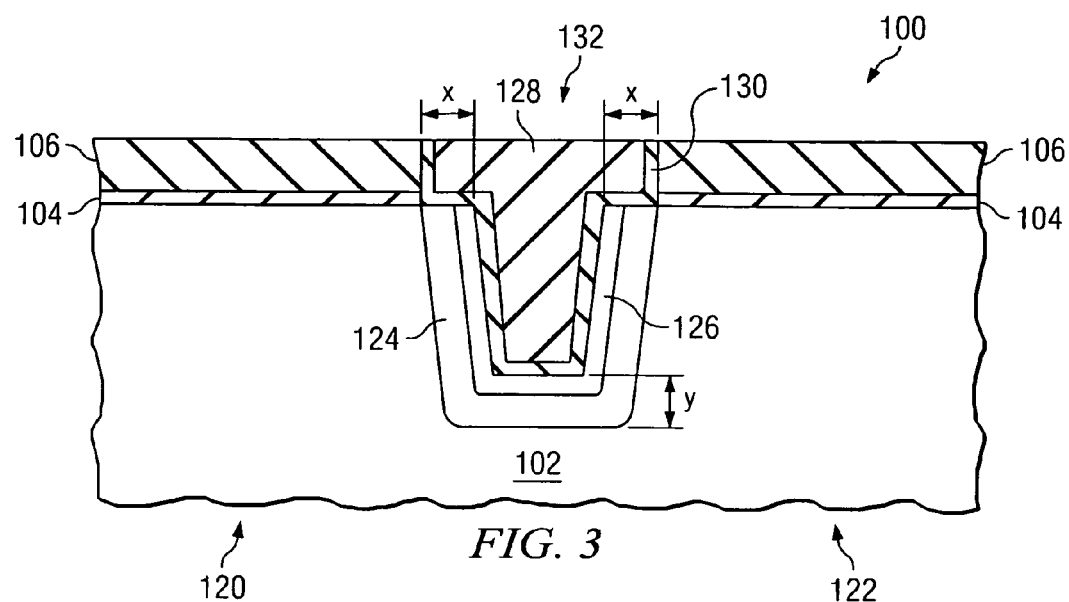

FIGS. 1 through 3 show cross-sectional views of a method of fabricating an isolation region of a semiconductor device 100 in accordance with a preferred embodiment of the present invention. First, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or germanium-on-insulator (GOI) substrate, for example.

A hard mask 104/106 is formed over the workpiece 102. The hard mask 104/106 preferably comprises a first insulating layer 104 and a second insulating layer 106 disposed over the first insulating layer 104, as shown. Alternatively, the hard mask 104/106 may comprise a single layer of material or three or more layers of material, for example, not shown. In the preferred embodiment shown, the first insulating layer 104 preferably comprises about 50 Angstroms of silicon dioxide, and the second insulating layer 106 preferably comprises about 1,000 Angstroms of silicon nitride. Alternatively, the hard mask 104/106 may comprise other materials and dimensions, for example.

A layer of photosensitive material 108 is deposited over the hard mask 104/106, as shown in FIG. 1. The layer of photosensitive material 108 may comprise a layer of photoresist, for example.

A lithography mask 110 is provided. The lithography mask 110 may comprise a substantially transparent material 112 and an opaque material 114 disposed over the transparent material 112, as shown. The opaque material 114 of the lithography mask 110 comprises a pattern for a trench of an isolation region. Alternatively, the lithography mask 110 may comprise an alternating phase shift mask and may comprise translucent regions in addition to and/or rather than opaque regions and transparent regions, not shown, for example.

Preferably, in some embodiments, the pattern for the isolation region trench on the lithography mask 110 is larger by an amount x to accommodate for a stress-altering material thickness that will be embedded in the isolation region trench, as shown. In these embodiments, an existing lithography mask 110 may be altered to implement embodiments of the present invention, to make the openings in the pattern for the trenches 118 wider by the amount x on all sides, for example. Alternatively, the pattern for the isolation region trench on the lithography mask 110 may be substantially the desired size of the insulating portion of the isolation region, for example, and an overetch process may be used. In these embodiments, advantageously, an existing lithography mask 110 may be used in the implementation of embodiments of the present invention, and modification of the existing lithography mask 110 is not required. An overetch process may be used to undercut the hard mask 104/106 (not shown in the drawings), for example, using an etch process with an isotropic or non-directional component, as an example. The etch process may be extended for a longer period of time to achieve the additional etching of the workpiece 102 by the amount x (laterally) and y (vertically) within the trench 118, for example.

The pattern of the lithography mask 110 is transferred to the layer of photosensitive material 108, e.g., by exposing the layer of photosensitive material 108 to light 116 or energy through the mask 110, as shown in FIG. 1. The layer of photosensitive material 108 is developed, and exposed portions of the layer of photosensitive material 108 are removed, e.g., if a positive photoresist is used. Alternatively, a negative photoresist may also be used for the layer of photosensitive material 108, not shown.

The hard mask 104/106 is then patterned, e.g., by etching away exposed portions of the hard mask 104/106, using the layer of photosensitive material 108 as a mask. The layer of photosensitive material 108 may then be removed, or it may be left remaining over the hard mask 104/106.

The hard mask 104/106 (and optionally, if the layer of photosensitive material 108 has not been removed, also the layer of photosensitive material 108) is used as a mask while exposed portions of the workpiece 102 are etched to form a trench 118 for each isolation region to be formed. Only one trench 118 is shown in the figures of the present patent application; however, there may be a plurality, e.g., dozens, hundreds, or thousands, of trenches 118 formed in a single workpiece 102, not shown.

The trench 118 may be formed between a first region 120 and a second region 122 of the semiconductor device 100, as shown. The first region 120 may comprise a region where an NFET will later be formed, and the second region 122 may comprise a region where a PFET will later be formed, in one embodiment, for example. In this embodiment, the first region 120 may be implanted with a p type dopant, and the second region 122 may be implanted with an n type dopant, for example.

Alternatively, in other embodiments, the first region 120 may comprise a region where a first active region will be formed, and the second region 122 may comprise a region where a second active region will be formed, for example. The first and second active regions may include transistors, complementary metal oxide semiconductor (CMOS) devices, memory devices, logic devices, power devices, circuitry components, groups of circuitry components, or combinations thereof, as examples, not shown. Alternatively, the first and second active regions of the first and second regions 120 and 122 may comprise other devices, for example.

The trench 118 preferably comprises a depth that is increased by an amount y to accommodate for the stress-altering material (not shown in FIG. 1; see FIG. 2 at 124) that will be embedded in the isolation region, in order to allow for an adequate amount of insulating material (also not shown in FIG. 1; see FIG. 3 at 128) to be formed within the trench 118, for example. The trench 118 may comprise a width of about 200 nm or greater, and may comprise a depth of about 200 nm or greater, as examples, depending on the technology node, minimum feature size, type of application of the semiconductor device 100, and the type of isolation, such as deep or shallow trench isolation, for example.

Next, a stress-altering material 124 is formed in the trench 118 to line the sidewalls and bottom surface of the trench 118 formed in the workpiece 102, as shown in FIG. 2. The stress-altering material 124 preferably comprises silicon combined with another element, such as Ge or C, as examples, although the element may also comprise other materials. In one embodiment, the stress-altering material 124 preferably comprises silicon germanium (SiGe), although alternatively, the stress-altering material 124 may comprise other materials, such as silicon carbon (SiC), as an example.

The stress-altering material 124 is preferably epitaxially grown, in some embodiments, for example, using a molecular beam epitaxy (MBE) process or other epitaxial growth process. Alternatively, the stress-altering material 124 may be formed by other methods, such as by a deposition process, e.g., a chemical vapor deposition (CVD) process, a physical vapor deposition (PVD) process, or other deposition processes may also be used. An epitaxial growth process may advantageously result in a better quality interface with the sidewalls and bottom surface of the trench 118 within the workpiece 102, for example.

In embodiments where the stress-altering material 124 is epitaxially grown, the epitaxial growth may be accomplished by exposing the workpiece 102 to a silicon-containing gas, an element-containing gas, and one or more carrier gases, for example. In an embodiment wherein the stress-altering material 124 comprises epitaxially grown SiGe, the epitaxial growth of the stress-altering material 124 may be achieved by exposing the workpiece 102 to a silicon-containing gas and a germanium containing gas, and also to a carrier gas, for example. Examples of gases that may be used to epitaxially grow an epi-SiGe stress-altering material 124 include $GeH_4$, silane ($SiH_4$), $SiH_2Cl_2$, HCl, $N_2$, $H_2$, He, or combinations thereof, as examples, although alternatively, other gases may also be used. If the stress-altering material 124 comprises SiC, preferably the workpiece 102 is exposed to silicon and carbon containing gases, for example. The epitaxial growth process to form the stress-altering material 124 may comprise a temperature of about 500 to 900 degrees C., a pressure of about 5 to 60 Torr, and a duration of about 2 to 30 minutes, as examples, although alternatively, the epitaxial growth process may comprise other processing parameters.

The stress-altering material 124 may comprise a thickness of about 500 nm or less, and preferably comprises a thickness such that space will be left remaining in the trench 118 to fill a portion of the trench 118 with an insulating material (such as insulating material 128 shown in FIG. 3). Thus, the thickness of the stress-altering material 124 is dependent upon the width and depth of the trench 118, for example. The stress-altering material 124 may comprise a thickness of a few hundred Angstroms to several hundred nm, for example. The thickness of the stress-altering material 124 is also dependant on the amount of stress that is desired to be induced or caused in the workpiece 102 proximate the stress-altering material 124, for example. The thicker the stress-altering material 124, the more stress will be induced in the workpiece 102, for example.

Optionally, in some embodiments, a layer of semiconductive material 126 may be formed over the stress-altering material 124 to line the stress-altering material 124, as shown in FIG. 2. The layer of semiconductive material 126 preferably comprises a thickness of about 100 Angstroms or less, and may comprise a thickness of about 20 to 50 Angstroms in some embodiments, for example. The layer of semiconductive material 126 preferably comprises silicon, for example, although other semiconductive materials may also be used.

The layer of semiconductive material 126 is preferably epitaxially grown in some embodiments, although alternatively, the layer of semiconductive material 126 may also be deposited, for example. If the stress-altering material 124 is formed epitaxially, then the element-containing gas (e.g., such as $GeH_4$) may be turned off during the epitaxial growth of the stress-altering material 124 to form a layer of semiconductive material 126 comprising Si, for example. The layer of semiconductive material 126 may also be formed using a deposition process, such as a CVD process, a PVD process, or other deposition methods, for example. The semiconductive material 126 may also be grown or deposited on the top surface of the stress-altering material 124, e.g., extending above the top surface of the workpiece 102, not shown. The excess semiconductive material 126 that may form is preferably etched away or removed in a later CMP process, for example.

Next, an insulating material 130/128 is formed over the layer of semiconductive material 126, or over the stress-altering material 124, if a layer of semiconductive material 126 is not formed, as shown in FIG. 3. The insulating material 130/128 may include a liner 130 and an insulating fill material 128, as shown. The liner 130 may comprise an insulating material such as silicon nitride ($Si_xN_y$), and the insulating fill material 128 may comprise silicon dioxide ($SiO_2$), in one embodiment, for example. The insulating material 130/128 preferably comprises $Si_xN_y$, SiON, a high dielectric constant (k) dielectric material having a dielectric constant of greater than about 3.9 (the approximate dielectric constant value of $SiO_2$), or combinations or multiple layers thereof, as examples, although other insulating materials may also be used. The liner 130 of the insulating material 130/128 may be formed by oxidation, nitridation, or deposition methods. The liner 130 and insulating fill material 128 may be formed by CVD, PVD, or low pressure CVD (LPCVD), although other deposition methods may also be used, for example.

Figure 11:
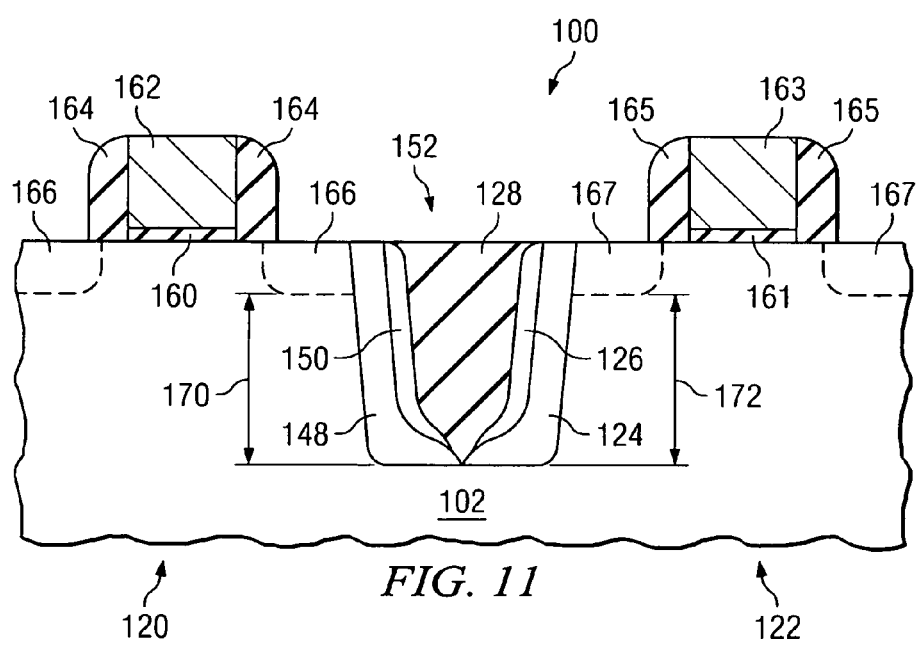
FIG. 11 shows a cross-sectional view of an isolation region implemented in a CMOS device, in accordance with an embodiment of the invention.

The insulating material 130/128 may be removed from over the top surface of the hard mask 104/106, e.g., using a CMP process, etch process, or combinations thereof. An etch or CMP process may also be used to remove the hard mask 104/106 and portions of the insulating material 130/128 from over the top surface of the workpiece 102, not shown in FIG. 3, for example (see FIG. 11, which shows the insulating material 128 coplanar with the top surface of the workpiece 102, after a CMP polish process). The isolation region 132 includes the insulating material 130/128, the stress-altering material 124, and the optional layer of semiconductive material 126. In a finished device 100, the insulating material 130/128 may extend slightly above a top surface of the workpiece 102, e.g., and may have a positive step height in some regions of the workpiece 102 (not shown), or alternatively, the insulating material 130/128 may be coplanar with a top surface of the workpiece 102, as shown in FIG. 11.

Referring again to FIG. 3, the stress-altering material 124 and the optional layer of semiconductive material 126 induce stress in the workpiece 102 on the sidewalls and bottom surface of the trench. The stress may comprise tensile or compressive stress, for example. Advantageously, the increased stress of the workpiece 102 caused by the stress-altering material 124 and semiconductive material 126 improves the performance of devices formed in the active regions in the first region 120 and the second region 122 of the workpiece 102. The isolation region 132 provides isolation between a first active region in the first region 120 and a second active region in the second region 122, for example.

The optional semiconductive material 126 provides more stress enhancement for the sidewalls and bottom surface of the trenches within the workpiece 102, for example. The optional semiconductive material 126 also improves the interface quality between the stress-altering material 124 and the insulating material 130/128, for example.

In the embodiment shown in FIGS. 1 through 3, a stress-altering material 124 is formed within the isolation trench that completely lines the trench. This is an advantage if the performance of devices in the first region 120 and the second region 122 will be improved by enhancing the stress of both regions 120 and 122, for example.

However, in some applications, it may be advantageous to increase the stress in one region 122, but not the other region 120 of the workpiece 102. For example, it may be desirable to enhance the stress of the workpiece 102 in the trench 118 proximate a PFET in the second region 122, but not enhance the stress of an NFET in the first region 120, in some applications. The embodiment of the present invention shown in FIGS. 4 through 9 illustrates a method of enhancing the stress of one side of the trench (region 122) but not the other side (region 120), to be described next.

FIGS. 4 through 9 show cross-sectional views of a method of fabricating an isolation region of a semiconductor device 100 in accordance with another preferred embodiment of the present invention, wherein an isolation region trench 118 is partially lined with a stress-altering material 124.

Figure 4:
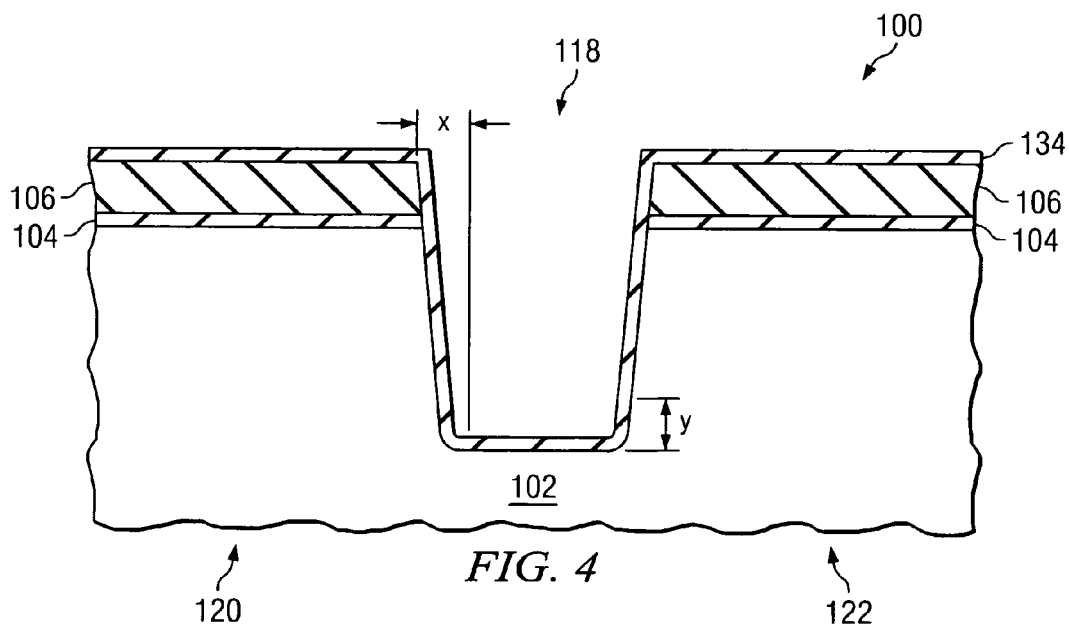
FIGS. 4 through 9 show cross-sectional views of a method of fabricating an isolation region of a semiconductor device in accordance with another preferred embodiment of the present invention.

In this embodiment, after an isolation region trench 118 is formed in the workpiece 102 as shown in FIG. 1, a masking material 134 is deposited over the top surface of the hard mask 104/106 and over the sidewalls and bottom surface of the trench 118 in the workpiece 102, as shown in FIG. 4. The masking material 134 preferably comprises an insulating material such as $SiO_2$, $Si_xN_y$, SiON, or combinations and multiple layers thereof, although alternatively, other materials may be used. The masking material 134 preferably comprises a thickness adequate to mask one side of the trench 118 while a stress-altering material 124 is formed on the other side 138 of the trench 118. The masking material 134 may comprise a thickness of about 50 nm or less, for example, although the masking material 134 may also comprise other dimensions.

Figure 5:
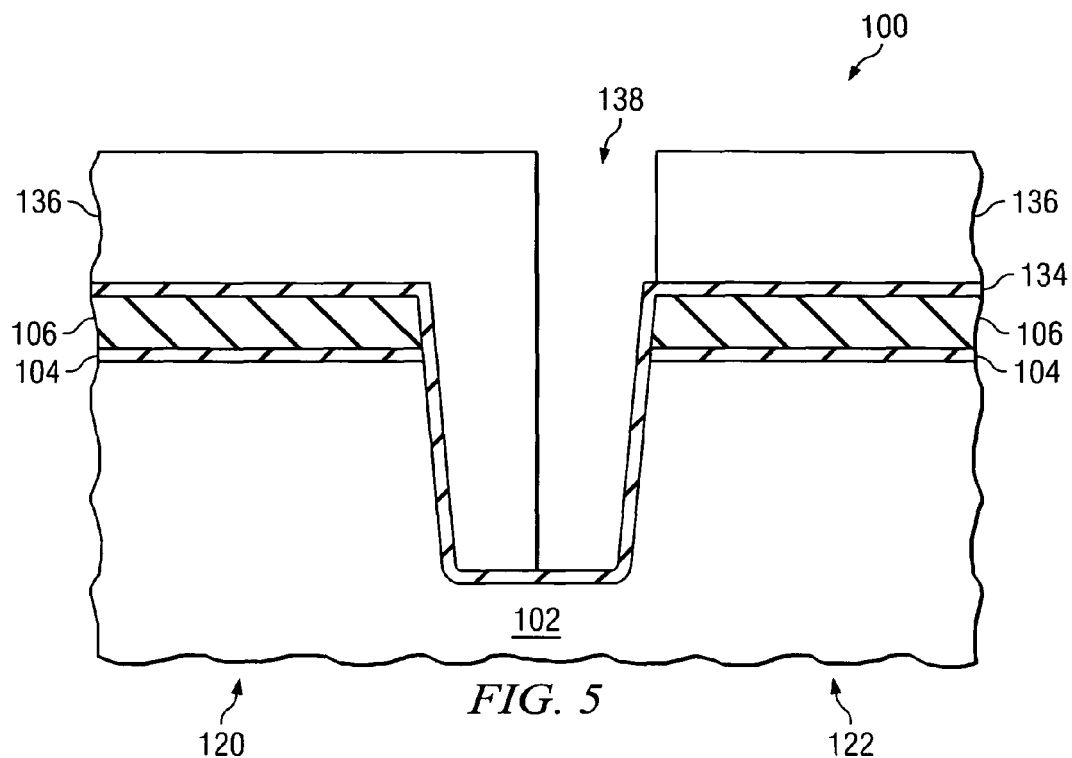
Figure 6:
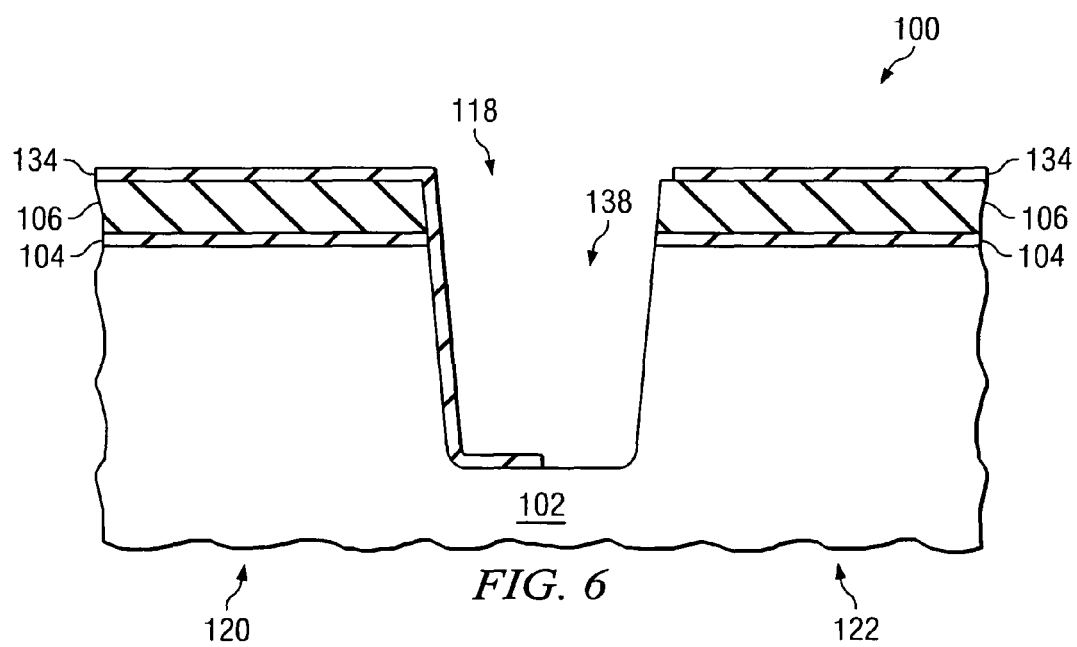

A layer of photosensitive material 136 is deposited over the masking material 134, as shown in FIG. 5. The layer of photosensitive material 136 is patterned using lithography, (e.g., using a lithography mask such as the mask 110 shown in FIG. 1 having a pattern for masking one side 138 of the trench 118) and the layer of photosensitive material 136 is used as mask while portions of the masking material 134 are etched away from the second region 122 of the workpiece 102 on one side 138, as shown in FIG. 6. The layer of photosensitive material 136 is then removed or stripped, leaving the masking material 134 disposed on the top surface of the hard mask 104/106 and on the sidewalls and bottom surface of a first side of the trench 118 proximate the first region 120. The masking material 134 has been removed from a second side 138 of the trench 118 proximate the second region 122 at this point of the manufacturing process, as shown.

Figure 7:
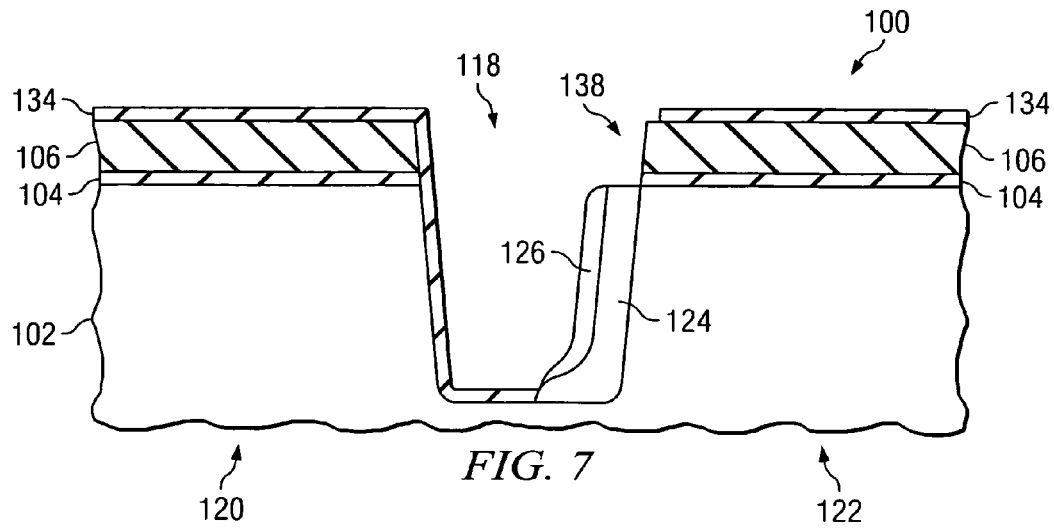

Next, a stress-altering material 124 is formed on the second side 138 of the trench, as shown in FIG. 7. The stress-altering material 124 preferably comprises similar materials deposited or formed by similar methods as described for the stress-altering material 124 shown in FIG. 2, for example. In one embodiment, the stress-altering material 124 preferably comprises epitaxially grown SiGe, which is effective in increasing compressive stress on the second side 138 of the trench 118 proximate a PFET device formed in the second region 122, for example.

The masking material 134 prevents the formation of the stress-altering material 124 in some embodiments, for example. In the embodiment shown in FIGS. 4 through 7, the masking material 134 prevents the formation of the stress-altering material 124 in the trench proximate the first region 120, for example. In other embodiments, the stress-altering material 124 may be formed over the entire trench and removed using lithography from the first region 120, for example, leaving the stress-altering material 124 on the second region 122 on the second side 138, for example.

Figure 8:
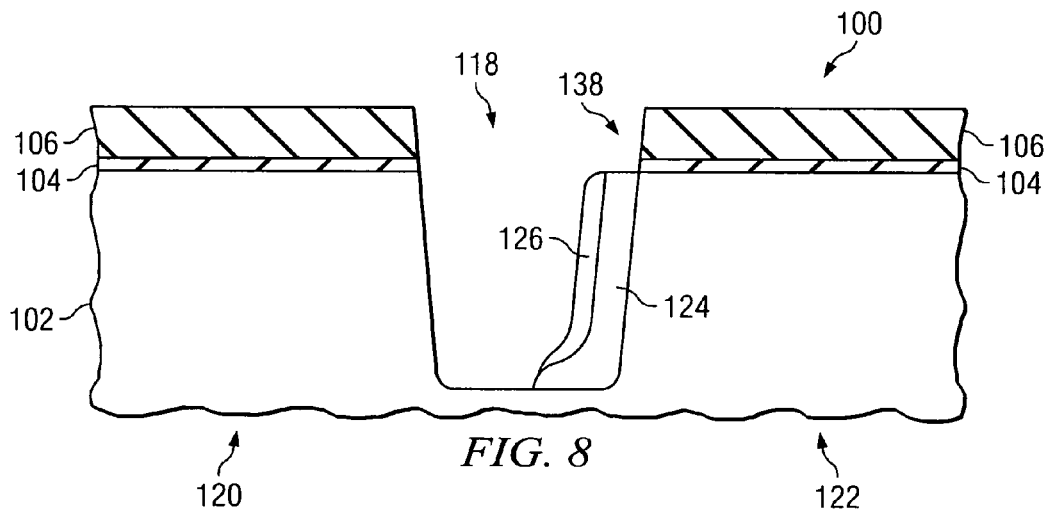

An optional layer of semiconductive material 126 may be formed over the stress-altering material 124, as shown in FIG. 7. The layer of semiconductive material 126 preferably comprises epitaxially-grown Si, in one embodiment, for example. The stress-altering material 124 and the optional layer of semiconductive material 126 may introduce uniaxial compressive stress in a channel of a PFET device formed in the second region 122, improving channel mobility and enhancing the PFET device performance, for example. The masking material 134 is then etched away or removed, as shown in FIG. 8, e.g., using an etch process.

Figure 9:
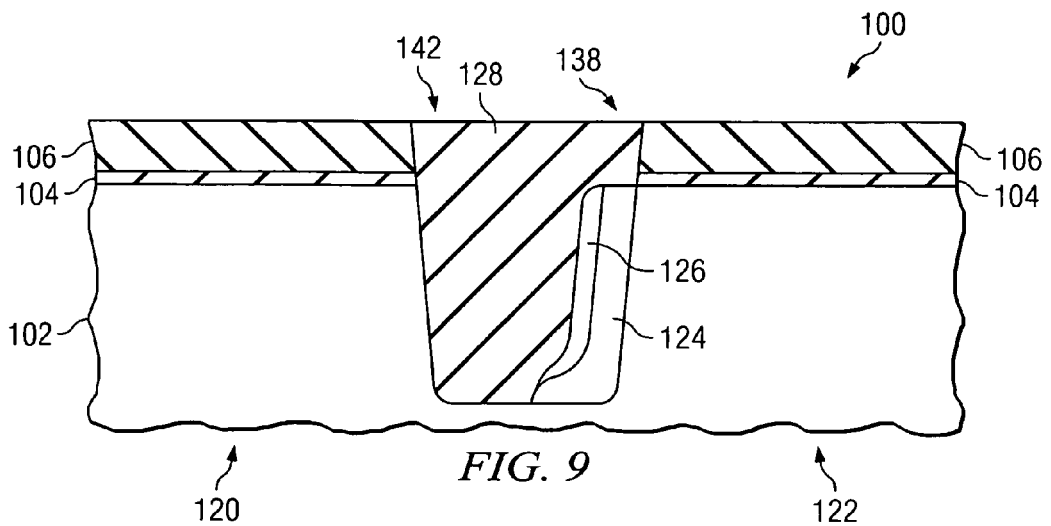

In some embodiments, the trench 118 is then filled with an insulating material 128, as shown in FIG. 9. The insulating material 128 preferably comprises one or more materials and is deposited similarly to the description of insulating material 128 in FIG. 3, for example. Advantageously, the stress of the workpiece 102 within the trench is not altered in the first region 120, because the stress-altering material 124 and optional layer of semiconductive material 126 are not formed over the trench in the first region 120. For example, if an NFET device is formed in the first region 120 and a PFET device is formed in the second region 122, the NFET device is not affected by the stress-altering material 124 of the isolation region 142 in the second region 122 of the workpiece 102. Altering the stress of a second side 138 but not altering the stress of a first side of the trench of the isolation region 142 may be advantageous in some applications, for example, if the semiconductor device 100 comprises a CMOS device.

If an NFET device is formed in the first region 120 and a PFET device is formed in the second region 122, preferably the stress-altering material 124 comprises SiGe in some embodiments, which is effective in increasing the compressive stress of atoms in the workpiece 102 proximate the second side 138 of the trench, for example. Alternatively, if a PFET device is formed in the first region 120 and an NFET device is formed in the second region 122, preferably the stress-altering material 124 comprises SiC in some embodiments, which is effective in increasing the tensile stress of atoms in the workpiece 102 proximate the second side 138 of the trench, for example. Altering the stress of the workpiece 102 within the trench improves the performance of the devices formed in the second region 122, in the embodiment shown in FIG. 9, yet devices in the first region 120 remain unaffected.

Figure 10:
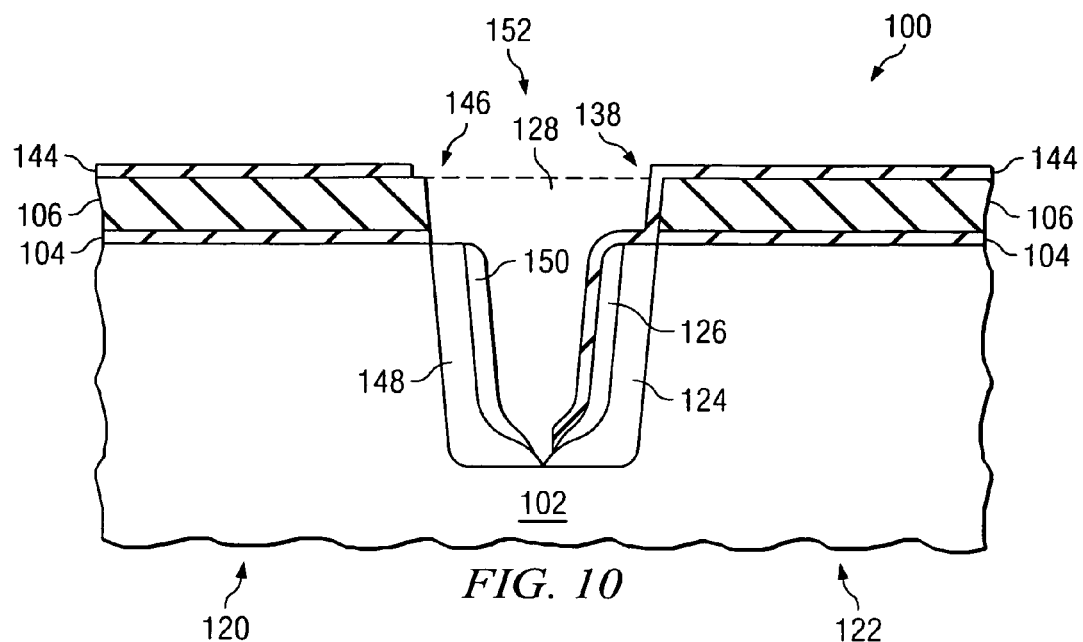
FIG. 10 shows a cross-sectional view of a method of fabricating an isolation region of a semiconductor device in accordance with yet another preferred embodiment of the present invention.

FIG. 10 shows a cross-sectional view of a method of fabricating an isolation region 152 of a semiconductor device 100 in accordance with yet another preferred embodiment of the present invention. In this embodiment, a first stress-altering material 148 is formed on a first side 146 of the isolation region trench, and a second stress-altering material 124 is formed on a second side 138 of the isolation region trench. The second stress-altering material 124 is preferably different than the first stress-altering material 148; e.g., the second stress-altering material 124 may comprise a different material or thickness than the first stress-altering material 148. The first and second stress-altering materials 148 and 124 shown in FIG. 10 are preferably formed using similar methods and materials as described for stress-altering material 124 shown in FIGS. 2 and 7, for example.

The first stress-altering material 148 may comprise SiC, and the second stress-altering material 124 may comprise SiGe, in some embodiments, e.g., in an embodiment wherein a first active region in the first region 120 comprises an NFET device, and wherein a second active region in the second region 122 comprises a PFET device. Advantageously, device performance of the NFET device in the first region 120 is improved by the tensile stress in the workpiece 102 proximate the NFET device provided by the first stress-altering material 148, and device performance of the PFET device in the second region 122 is improved by the increase in compressive stress in the workpiece 102 proximate the PFET device provided by the second stress-altering material 124, in this embodiment.

To manufacture the semiconductor device 100 including an isolation region 152 having a first stress-altering material 148 on a first side 146 and a second stress-altering material 124 on a second side 138, first, the second stress-altering material 124 and an optional second layer of semiconductive material 126 may be formed on the second side 138, as shown and described with reference to FIGS. 5 through 8. Then, a masking material 144 is formed over the top surface of the hard mask 104/106, over the layer of semiconductive material 126 or second stress-altering material 124, and over the first side 146 of the trench. The masking material 144 preferably comprises similar materials and dimensions as described with reference to masking material 134 of FIG. 4, for example. The masking material 144 is removed from over the first side 146 of the trench, e.g., using a layer of photosensitive material and lithography (not shown; see FIGS. 5 and 6), as shown in FIG. 10. The first stress-altering material 148 is then formed over the first side 146 of the isolation region 152 trench, and an optional first layer of semiconductive material 150 may be formed over the first stress-altering material 148, also shown in FIG. 10. An insulating material 128 is then deposited over the trench to fill the trench above the first and second stress-altering materials 148 and 124, or over the first and second layers of semiconductive material 150 and 126, if present, as shown in phantom in FIG. 10.

Again, as in the other embodiments described herein, an optional layer of semiconductive material 150 and 126 may be formed over the first and second stress-altering materials 148 and 124, respectively, as shown in FIG. 10. The layer of semiconductive material 150 and 126 may be formed after the formation of the first and second stress-altering materials 148 and 124, respectively. Alternatively, the second stress-altering material 124 may be formed, and a masking material 144 may be formed on the second side 138 over the second stress-altering material 124. The first stress-altering material 124 is then formed on the first side 146 of the trench, and the masking material 144 is then removed (not shown in the drawings). A single layer of semiconductive material (e.g., 150 or 126) may then optionally be formed simultaneously over both the first and second stress-altering materials 148 and 124, for example.

FIG. 11 shows a cross-sectional view of an isolation region 152 in accordance with an embodiment of the invention implemented in a CMOS device. The CMOS device includes an NFET device formed in the first region 120 and a PFET device formed in the second region 122. For example, the NFET device in the first region 120 includes a gate dielectric material 160, a gate material 162 disposed over the gate dielectric material 160, and insulating sidewall spacers 164 formed over the sidewalls of the gate 162 and gate dielectric 160, as shown. Source and drain regions 166 are formed in the workpiece 102 proximate the gate and gate dielectric 162/160. The PFET device formed in the second region 122 includes a gate dielectric material 161, a gate material 163 disposed over the gate dielectric material 161, and insulating sidewall spacers 165 formed over the sidewalls of the gate 163 and gate dielectric 161, as shown. Source and drain regions 167 are formed in the workpiece 102 proximate the gate and gate dielectric 163/161.

The stress-altering material 148 and optional layer of semiconductive material 150 enhance the performance of the NFET device in the first region 120, and the stress-altering material 124 and optional layer of semiconductive material 126 enhance the performance of the PFET device in the second region 122. The stress-altering material 148 and optional layer of semiconductive material 150 increase the stress in region 170 of the workpiece 102 proximate the stress-altering material 148. Likewise, the stress-altering material 124 and optional layer of semiconductive material 126 increase the stress in region 172 of the workpiece 102 proximate the stress-altering material 124. Either the NFET device, the PFET device, or both the NFET device and the PFET device, may include the novel stress-altering material 148 and 124, and optional layers of semiconductive material 150 and 126 described herein.

In some embodiments, a stress-altering material may also be embedded within a source region or drain region 167 of a PFET and/or source or drain region 166 of an NFET device, for example. For example, the source and/or drain regions 166 of the NFET device in the first region 120 and the source and/or drain regions 167 of the PFET device in the second region 122 may include a stress-altering material such as SiGe, SiC, Si, other stress-inducing materials, or combinations thereof, as examples. Advantageously, a stress-altering material comprising SiGe embedded in the source and drain regions 167 introduces uniaxial compressive stress in a channel region of the transistors in the workpiece 102 disposed beneath the gate dielectric 161, for example.

The devices in the active regions in the first region 120 and the second region 122 may be formed before, or after, or partially before and partially after, the formation of the novel isolation regions 132, 142, and 152 described herein, for example.

The insulating material 128 portion of the isolation regions 132, 142, and 152 preferably comprise the same depth and width as an isolation region typically used for a semiconductor device 100 design, for example, in some embodiments. Thus, in these embodiments, the trench 118 depth and width is preferably increased by an amount y and x, respectively, to allow for the formation of the novel stress-altering materials 124 and 148 and optional layers of semiconductive material 126 and 150 described herein.

Advantages of embodiments of the invention include providing novel isolation region structures 132, 142, and 152 and methods of fabrication thereof, wherein the isolation regions 132, 142, and 152 provide isolation between adjacent action regions and devices, while also enhancing stress in the workpiece 102, thus enhancing performance of the active regions and devices. For example, if the active regions comprise transistors, the on and off current ($I_{on}$ and $I_{off}$) of the transistors may be altered using the stress-altering materials 124 and 148 described herein. The stress-altering material 124 may increase the on current $I_{on}$ for a PFET device formed in the second region 122 of a semiconductor device 100, as an example. Channel mobility may also be improved.

The stress-altering materials 124 and 148 may be implemented in isolation regions 132, 142, and 152 in a variety of configurations. The stress-altering materials 124 and 148 may be symmetric or asymmetric within an isolation region 132, 142, and 152, for example. A single type of stress-altering material 124 may be used to alter the stress of the workpiece 102 within an entire trench 118, as shown in FIG. 3. The stress-altering material 124 may increase the tensile or compressive stress of the workpiece 102 proximate the stress-altering material 124, for example. Alternatively, the stress-altering material 124 may be formed in one side 138 of a trench 118, but not the other, as shown in FIG. 9.

Two different types of stress-altering materials 124 and 148 may also be used, as shown in FIG. 10, wherein one stress-altering material 124 causes compressive or tensile stress in the workpiece 102 proximate one side of the trench, and wherein another stress-altering material 148 causes tensile or compressive stress in the workpiece proximate another side of the trench, for example. In another embodiment, the stress-altering materials 124 and 148 may induce the same type of stress, e.g., compressive or tensile, in the workpiece first region 120 and second region 122 in differing amounts, due to a different thickness or material type, for example.

Advantageously, the stress-altering materials 124 and 148 are preferably formed early in the manufacturing process flow, so that a high temperature pre-bake step of the workpiece 102 may be performed before forming the stress-altering materials 124 and 148. The high temperature pre-bake step may comprise a temperature of about 800 to 1,000 degrees C., for example, although alternatively, the high temperature pre-bake step may comprise other temperatures. The high temperature pre-bake step may remove contaminants, such as carbon and/or oxygen, which may reside on the surface of trench 118, for example. The high temperature pre-bake step may also stabilize the surface chemistry and improve the quality of the epitaxial layers grown, such as the stress-altering material 124, 148, and the optional layers of semiconductive material 126 and 150, for example.

Furthermore, the stress-altering materials 124 and 148 may advantageously be formed epitaxially at relatively high temperatures, increasing the throughput, for example.

The isolation regions 132, 142, and 152 may comprise shallow trench isolation (STI) regions, deep trench (DT) isolation regions, or a combination of both STI regions and DT isolation regions. For example, the isolation regions 132, 142, and 152 may comprise STI regions that comprise a depth of a few hundred nm within a workpiece 102, or the isolation regions 132, 142, and 152 may comprise DT isolation regions that extend beneath a top surface of the workpiece 102 by about 1,000 nm or more. Alternatively, the isolation regions 132, 142, and 152 may comprise an STI region proximate a top surface of the workpiece 102 and may include a DT isolation region disposed beneath the STI region, as an example (not shown).

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    forming at least one isolation region within a workpiece, the at least one isolation region comprising:
        a stress-altering material layer comprising a first stress-altering material and a second stress-altering material in contact with a trench within the workpiece so as to at least partially line, but not fill the trench, wherein a bottom surface of the trench comprises a first semiconductor material, and wherein the stress-altering material layer comprises a second semiconductor material different from the first semiconductor material, and wherein the second stress-altering material comprises a third semiconductor material different than the second semiconductor material,
        a layer of semiconductor material lining the stress-altering material layer, the layer of semiconductor material disposed over the stress-altering material layer, and
        an insulating material disposed over the layer of semiconductor material;
    forming a first active region proximate a first side of the at least one isolation region, the first stress-altering material lining the trench proximate the first active region; and
    forming a second active region proximate a second side of the at least one isolation region, the second stress-altering material lining the trench proximate the second active region, wherein the first stress-altering material is disposed proximate the first active region, but not proximate the second active region.

2. The method according to claim 1, wherein the at least one isolation region provides isolation between the first active region and the second active region.

3. A method of forming an isolation region of a semiconductor device, the method comprising:
    forming a trench having a bottom and sidewalls in a workpiece, the bottom and sidewalls comprising a first semiconductor material;
    at least partially lining without filling the trench with a stress-altering material layer, said stress-altering material layer in contact with said bottom and sidewalls of said trench, wherein the stress-altering material layer comprises a second semiconductor material different from the first semiconductor material, wherein at least partially lining the trench with the stress-altering material layer comprises forming a first stress-altering material on a first side of the trench and forming a second stress-altering material on a second side of the trench, the second stress-altering material being different than the first stress-altering material;
    disposing a layer of semiconductor material conformally formed over said stress-altering material layer; and
    filling the trench with an insulating material.

4. The method according to claim 3, wherein at least partially lining the trench with the stress-altering material layer comprises epitaxially growing the stress-altering material layer.

5. The method according to claim 3, wherein a layer of epitaxially grown silicon covers the stress-altering material layer.

6. The method according to claim 3, wherein forming the first stress-altering material comprises depositing a first masking material over the trench, removing the first masking material from the first side of the trench, and lining the first side of the trench with the first stress-altering material.

7. The method according to claim 6, wherein forming the second stress-altering material comprises removing the first masking material from the second side of the trench, depositing a second masking material over the trench, removing the second masking material from the second side of the trench, and lining the second side of the trench with the second stress-altering material.

8. A semiconductor device comprising:
    at least one isolation region disposed within a workpiece, the at least one isolation region comprising:

a trench formed within the workpiece, wherein a bottom surface of the trench comprises a first semiconductor material, a stress-altering material layer comprising a first stress-altering material and a second stress-altering material in contact with and at least partially lining, but not filling, the trench, wherein the stress-altering material layer comprises a second semiconductor material different from the first semiconductor material, and wherein the second stress-altering material comprises a third semiconductor material different than the second semiconductor material, a layer of semiconductor material formed as a liner and directly disposed over the stress-altering material layer, the layer of semiconductor material having the first semiconductor material, and an insulating material filling the trench over the layer of semiconductor material;

a first active region proximate a first side of the at least one isolation region, the first stress-altering material lining the trench proximate the first active region; and a second active region proximate a second side of the at least one isolation region, the second stress-altering material lining the trench proximate the second active region, wherein the first stress-altering material is disposed proximate the first active region, but not proximate the second active region.

9. The semiconductor device according to claim 8, wherein the second semiconductor material comprises SiGe, SiC, or both SiGe and SiC.

10. The semiconductor device according to claim 8, wherein the trench comprises a depth within the workpiece of about 200 nm or greater.

11. The semiconductor device according to claim 8, wherein the stress-altering material layer comprises a thickness of about 500 nm or less.

12. The semiconductor device according to claim 8, wherein the layer of semiconductor material comprises about 100 Angstroms or less of silicon.

13. The semiconductor device according to claim 8, wherein the insulating material of the isolation region comprises $SiO_2$, $Si_xN_y$, SiON, a dielectric material having a dielectric constant of greater than about 3.9, or combinations or multiple layers thereof.

14. A semiconductor device, comprising:
a first active region disposed within a workpiece;
a second active region disposed within the workpiece proximate the first active region; and
an isolation region disposed between the first active region and the second active region, the isolation region comprising a trench having a first sidewall and an opposite second sidewall and a bottom disposed in the workpiece, wherein the bottom of the trench comprises a first semiconductor material, wherein the trench is at least partially lined with a first stress-altering semiconductive material layer in contact with a first portion of said bottom and first sidewall of said trench, wherein the isolation region includes a semiconductor liner directly disposed over the first stress-altering semiconductive material layer, and an insulating layer disposed over the semiconductor liner and filling the trench, wherein the first stress-altering semiconductive material layer is a second semiconductor material different from the first semiconductor material, wherein the isolation region includes a second stress-altering semiconductive material layer disposed over the second sidewall and a remaining portion of the bottom of the trench, the second stress-altering semiconductive material layer being a different material than or having a different thickness than the first stress-altering semiconductive material layer.

15. The semiconductor device according to claim 14, wherein the second semiconductor material comprises silicon combined with an element.

16. The semiconductor device according to claim 14, wherein the first active region comprises a p channel field effect transistor (PFET) and the second semiconductor material comprises SiGe, or wherein the second active region comprises an n channel field effect transistor (NFET) and the second semiconductor material comprises SiC.

17. The semiconductor device according to claim 16, further comprising another stress-altering semiconductive material embedded within a source or drain region of the PFET or the NFET.

18. The semiconductor device according to claim 14, wherein the first stress-altering semiconductive material layer causes compressive stress in the workpiece proximate the first sidewall of the trench, and wherein the second stress-altering semiconductive material layer causes tensile stress in the workpiece proximate the second sidewall of the trench.

19. The semiconductor device according to claim 14, wherein the isolation region comprises a shallow trench isolation (STI) region, a deep trench (DT) isolation region, or both a STI region and a DT isolation region.

20. The semiconductor device according to claim 14, wherein the first active region and the second active region comprise transistors, complementary metal oxide semiconductor (CMOS) devices, memory devices, logic devices, power devices, circuitry components, groups of circuitry components, or combinations thereof.

21. The semiconductor device according to claim 14, wherein the second stress-altering semiconductive material layer is a different semiconductor material than the first stress-altering semiconductive material layer.

22. A semiconductor device comprising an isolation region disposed within a workpiece, the isolation region comprising:
a trench having a first sidewall and an opposite second sidewall and a bottom disposed in the workpiece, wherein the bottom of the trench comprises a first semiconductor material;
a first stress-altering semiconductive material layer in contact with the first sidewall of said trench, wherein the first stress-altering semiconductive material layer is a second semiconductor material different from the first semiconductor material;
a second stress-altering semiconductive material layer disposed over the second sidewall, wherein the second stress-altering semiconductive material layer is a different material, or has a different thickness, than the first stress-altering semiconductive material layer;
a semiconductor liner disposed over the first and the second stress-altering semiconductive material layers; and
an insulating layer disposed over the semiconductor liner.

23. The semiconductor device according to claim 22, wherein the first stress-altering semiconductive material layer is in contact with a first portion of said bottom of said trench.

24. The semiconductor device according to claim 23, wherein the second stress-altering semiconductive material layer is in contact with a remaining portion of the bottom of the trench.

25. The semiconductor device according to claim 22, wherein the second semiconductor material comprises silicon combined with an element.

26. The semiconductor device according to claim 22, further comprising a first active region disposed proximate the first sidewall and a second active region disposed proximate the second sidewall, wherein the first active region comprises a p channel field effect transistor (PFET) and the second semiconductor material comprises SiGe, and wherein the second active region comprises an n channel field effect transistor (NFET) and the material of the second stress-altering semiconductive material layer comprises SiC.

27. The semiconductor device according to claim 26, further comprising another stress-altering semiconductive material embedded within a source or drain region of the PFET or the NFET.

28. The semiconductor device according to claim 22, wherein the first stress-altering semiconductive material layer causes compressive stress in the workpiece proximate the first sidewall of the trench, and wherein the second stress-altering semiconductive material layer causes tensile stress in the workpiece proximate the second sidewall of the trench.

29. The semiconductor device according to claim 22, wherein the isolation region comprises a shallow trench isolation (STI) region, a deep trench (DT) isolation region, or both a STI region and a DT isolation region.

30. The semiconductor device according to claim 22, further comprising a first active region disposed proximate the first sidewall and a second active region disposed proximate the second sidewall, wherein the first active region and the second active region comprise transistors, complementary metal oxide semiconductor (CMOS) devices, memory devices, logic devices, power devices, circuitry components, groups of circuitry components, or combinations thereof.

31. The semiconductor device according to claim 22, wherein the second stress-altering semiconductive material layer is a different semiconductor material than the first stress-altering semiconductive material layer.

* * * * *